United States Patent
Muenzer et al.

(10) Patent No.: US 9,276,155 B2
(45) Date of Patent: Mar. 1, 2016

(54) SOLAR CELL HAVING DIELECTRIC BACK REFLECTIVE COATING AND METHOD FOR THE PRODUCTION THEREOF

(75) Inventors: Adolf Muenzer, Unterschleissheim (DE); Andreas Teppe, Constance (DE); Jan Schoene, Reichenau (DE); Reinhold Schlosser, Munich (DE); Steffen Keller, Constance (DE)

(73) Assignee: RCT Solutions GmbH, Constance (DE)

( * ) Notice: Subject to any disclaimer, the term of this patent is extended or adjusted under 35 U.S.C. 154(b) by 645 days.

(21) Appl. No.: 13/582,502

(22) PCT Filed: Mar. 3, 2011

(86) PCT No.: PCT/DE2011/075036
§ 371 (c)(1),
(2), (4) Date: Oct. 1, 2012

(87) PCT Pub. No.: WO2011/107094
PCT Pub. Date: Sep. 9, 2011

(65) Prior Publication Data
US 2013/0061924 A1 Mar. 14, 2013

(30) Foreign Application Priority Data

Mar. 3, 2010 (DE) .......................... 10 2010 010 221
Mar. 5, 2010 (DE) .......................... 10 2010 010 561
Jul. 2, 2010 (DE) .......................... 10 2010 025 983

(51) Int. Cl.
| H01L 21/00 | (2006.01) |
| H01L 21/44 | (2006.01) |
| H01L 31/068 | (2012.01) |
| H01L 31/0224 | (2006.01) |
| H01L 31/18 | (2006.01) |
| H01L 31/056 | (2014.01) |

(52) U.S. Cl.
CPC ...... *H01L 31/068* (2013.01); *H01L 31/022425* (2013.01); *H01L 31/056* (2014.12); *H01L 31/1804* (2013.01); *Y02E 10/52* (2013.01); *Y02E 10/547* (2013.01)

(58) Field of Classification Search
CPC ..................... H01L 31/022425; H01L 31/068; H01L 31/056; H01L 31/1804; H01L 27/14636; H01L 21/76897; H01L 21/76843; H01L 21/76802; H01L 2924/01029; H01L 2924/01078; H01L 31/18; H01L 31/1896; Y02E 10/52; Y02E 10/547; Y02E 10/50
See application file for complete search history.

(56) References Cited

U.S. PATENT DOCUMENTS

2004/0200520 A1* 10/2004 Mulligan et al. ............... 136/256
2009/0223562 A1* 9/2009 Niira et al. ..................... 136/256
(Continued)

FOREIGN PATENT DOCUMENTS

| DE | 102006046726 A1 | 4/2008 | |
| DE | 102007041392 A1 | 3/2009 | |
| JP | 2006073617 | * 3/2006 | .................... 136/256 |
| JP | 2006073617 A | 3/2006 | |

(Continued)

OTHER PUBLICATIONS

Sebastian Gloger, et al.: "Investigation of the back side Passivation Layer of Screen Printed Bifacial Silicon Solar Cells", University of Konstanz, Department of Physics, Konstanz, Germany 24th European Photovoltaic Solar Energy Conference, Sep. 21-25, 2009, Hamburg, Germany, p. 1544-1547.

*Primary Examiner* — Michelle Mandala
(74) *Attorney, Agent, or Firm* — Laurence A. Greenberg; Werner H. Stemer; Ralph E. Locher

(57) ABSTRACT

In a method for producing a solar cell, a layer stack of dielectric layers is applied to a back of a solar cell substrate and the layer stack is heated and is held at temperatures of at least 700° C. during a time period of at least 5 minutes. The novel solar cell has a layer stack of dielectric layers on its back. At least one of the dielectric layers of the layer stack is densified so that its resistivity to firing-through of pastes with glass components is enhanced.

14 Claims, 4 Drawing Sheets

(56) References Cited

U.S. PATENT DOCUMENTS

2010/0317146 A1* 12/2010 Sinha et al. .................. 438/96
2011/0005582 A1    1/2011 Szlufcik et al.

FOREIGN PATENT DOCUMENTS

| WO | 2009030299 A2 | 3/2009 |
| WO | 2009071561 A2 | 6/2009 |

* cited by examiner

SOLAR CELL HAVING DIELECTRIC BACK REFLECTIVE COATING AND METHOD FOR THE PRODUCTION THEREOF

BACKGROUND OF THE INVENTION

Field of the Invention

The invention concerns a solar cell with a dielectric back reflective coating formed of a layer stack of dielectric layers arranged on the back of the solar cell and a method for the production of a solar cell, wherein a layer stack of dielectric layers is applied to the back of a solar cell substrate, local openings are formed in the layer stack, a metallic medium is applied extensively to the layer stack, with the metallic medium being partially injected into the local openings, the solar cell substrate is fired, in order to form ohmic contacts in the local openings. During firing any firing-through of parts of the metallic medium located on the layer stack through the layer stack is prevented.

In the domain of photovoltaics, the aim is to reduce the expense of generating electricity. One way this can be done is by increasing the efficiency of manufactured solar cells, and another is by reducing the expense required to manufacture solar cells. An improvement in efficiency requires that a greater proportion of irradiated light quanta generates electron hole pairs and/or a greater proportion of the generated electron hole pairs is conducted away before they can recombine. The result is an improvement in what is known as the quantum yield or quantum efficiency.

There is particular potential for improvement in the red spectral region, due to the comparatively greater absorption lengths of the long-wave, red light components. Since ever-thinner solar cell substrates, for example silicon discs, are being used in industrial solar cell production, the red spectral region is also becoming increasingly important. To improve quantum efficiency, therefore, a metal layer is applied as optical reflector to the back of the solar cell substrate, i.e. on a side of the solar cell substrate facing away from incident light. As a result, long-wave light incident on the front of the solar cell substrate is reflected to the back of the solar cell substrate. This increases the probability of absorption in the volume of the solar cell substrate and hence the probability of the generation of an electron hole pair. Without optical reflectors on the back of the solar cell substrate, however, a greater proportion of light would pass through the solar cell substrate without being absorbed. It has, however, been shown that this type of metallic optical reflector is associated with a high charge carrier recombination rate at the interface of the metal with the solar cell substrate. This can be circumvented by providing a dielectric reflective coating on the back of the solar cell substrate instead of metallic back reflectors. To this end, one or more dielectric layers are applied on the back of the solar cell substrate. These are designed in such a way that light quanta striking the dielectric layers are reflected by the total-reflection effect. This effect replaces the reflection of the light quanta to the optically denser medium which occurs with metallic back reflectors.

With dielectric back reflective coatings of this type the recombination rate of the charge carrier on the back can be significantly reduced. Recombination rates of less than 500 cm/s can be achieved. The full-area aluminium back contact, standard until now, with a back field (often referred to as back surface field), however, achieves only recombination rates in the order of magnitude of 1000 cm/s. An ohmic metallic back contact used as back reflector without back field even has recombination rates over $10^6$ cm/s.

To conduct away the electricity generated, an electrical contacting of the back of the solar cell substrate is necessary. However, this cannot be realised using dielectric layers. Therefore, in addition to the dielectric back reflector, metallic contacts must be provided. This can be done, for example, by locally piercing the dielectric layers and forming metal contacts in the openings formed. For example, the dielectric layers can be pierced locally by means of laser beam evaporation and metal contacts can be vacuum-metallised. This way of forming back contacts, however, is expensive by comparison with the printing processes usually used in industrial solar cell production, such as for example screen printing or spray printing processes. But the printing processes used in industrial production cannot be used unaltered in connection with dielectric layers for back contacting of solar cell substrates. This is due to the fact that the pastes used in these printing processes contain glass components, known as glass frit. The effect of these is that the pastes are fired through the dielectric layers in the firing process necessary to form the contacts, thereby destroying them. The use of pastes which contain no glass components has proven similarly problematic, since contacts produced with such pastes have inadequate adhesion to the solar cell substrate.

To prevent pastes containing glass frit from firing through the dielectric layers, it is possible in principle to make the dielectric layers so thick that this is prevented. However, this brings with it a substantial additional production cost.

The improvement in efficiency achieved by the use of a dielectric back reflective coating is thus now overcompensated by the additional production cost associated with the dielectric back reflective coating.

BRIEF SUMMARY OF THE INVENTION

Against the background described, the present invention is based on the problem of providing a method which enables economical dielectric reflective coating and contacting of a solar cell back.

This problem is solved by a method as claimed.

The present invention is also based on the problem of providing a solar cell with a dielectric reflective back which can be economically produced.

This problem is solved by a solar cell as claimed.

Advantageous refinements are the subject matter of the respective independent claims.

The method according to the invention provides that a layer stack of dielectric layers is applied to the back of a solar cell substrate. This layer stack is heated and held at temperatures of at least 700° C. for a period of at least 5 minutes. The first-mentioned problem is already solved by a method which has these features.

Surprisingly, it has emerged that as a result of the heating and holding of the layer stacks as described at temperatures of at least 700° C., the resistivity of one or more dielectric layers of the layer stack to a firing-through of pastes containing glass components can be enhanced. Such an enhancement of resistivity is referred to here for short as densification. So far, it has not been clarified which processes take place in one or more dielectric layers during the heating and holding at temperatures of at least 700° C. and lead to a densification of one or more dielectric layers.

Preferably, the layer stack is held for a periods of at least 10 minutes at temperatures of at least 700° C.

The period during which the layer stack is held at temperatures of at least 700° C. can in principle be interrupted by phases in which the layer stack is at temperatures of less than 700° C. So several time segments may be provided in which the layer stack is held at temperatures of at least 700° C. Cumulatively, these time segments extend over at least 5 minutes, preferably over at least 10 minutes.

It is preferable to use a silicon solar cell substrate as solar cell substrate.

Advantageously a layer stack is applied which has a silicon oxide layer with a thickness of less than 100 nm. Especially when silicon solar cell substrates are used, this enables good passivation of superficial defect states. The thickness of the silicon oxide layer is preferably between 5 nm and 100 nm, especially preferably between 10 nm and 100 nm. Said silicon oxide layer can in principle be applied in any way known in the art. For example, the silicon oxide layer can be applied using chemical deposition from a vapour phase. If a silicon solar cell substrate is used, the silicon oxide layer can be formed by thermal oxidation of the silicon solar cell substrate.

In practice, it has proven effective to use a layer stack which has a silicon nitride layer with a thickness of less than 200 nm. The silicon nitride layer can, for example, be applied by means of chemical deposition from the vapour phase. In this case, in particular, plasma-enhanced chemical vapour deposition (PECVD) or low-pressure chemical vapour deposition (LPCVD) processes can be used. Silicon nitride layers with a thickness of less than 200 nm can be applied economically. Preferably, the thickness of the silicon nitride layer is between 50 nm and 200 nm, especially preferably between 70 nm and 150 nm.

It has been shown that silicon nitride layers can be densified by being heated and held at temperatures of at least 700° C. for a period of at least 5 minutes. As well as silicon nitride layers, layers of silicon oxide, silicon carbide, aluminium oxide, titanium oxide or tantalum nitride can also be densified in this way.

Advantageously a layer stack is applied which has a silicon oxide layer and a silicon nitride layer. In this case, it is preferable firstly to apply the silicon oxide layer onto the back of the solar cell substrate and then the silicon nitride layer on the silicon oxide layer. It is especially preferable if the silicon oxide layer is applied directly onto the solar cell substrate and the silicon nitride layer is applied directly onto the silicon oxide layer. This enables a wide-ranging dielectric passivation of the back of the solar cell substrate, so that very low charge carrier recombination rates can be realised on the back of the solar cell substrate. At the same time, the layer stack, because of the densified silicon nitride layer, has enhanced resistivity to firing-through of pastes containing glass components.

Advantageously, after applying the layer stack on the back of the solar cell substrate, dopant is diffused into the solar cell substrate in a diffusion step and during this diffusion step the layer stack is held for periods of at least 5 minutes at temperatures of at least 700° C. In this way, the densification of at least one dielectric layer can be integrated economically into the solar cell production process, since the at least one dielectric layer can be densified during the diffusion step, which is required in any case.

Preferably, the diffusion step is an emitter diffusion step. This can in principle be arranged in any way known in the art. For example, it may be an emitter diffusion from the gas phase, for example a $POCl_3$ diffusion, or a diffusion of dopant from precursor layers (known as precursor diffusions). Depending on the solar cell substrate used, the diffusion step can be in the form of an n- or p-diffusion step.

During the diffusion step, the layer stack can be used as diffusion mask for the back of the solar cell substrate. In this way a one-sided emitter diffusion can be realised economically. This works to advantageous effect in particular in the frequently-used gas phase diffusions, for example in said $POCl_3$ diffusion. This is because, as a result of the one-sided emitter diffusion, the edge insulation required for full-contact emitter diffusions is no longer needed, thus reducing the cost of manufacture.

Advantageously, local openings are formed in the layer stack. This can be done, for example, by means of laser beam evaporation. Alternatively, a suitable etching paste can be applied locally onto the layer stack, which can be pierced locally by etching.

If the local openings are formed by means of laser beam evaporation, it has proven effective to form the local openings as local linear openings. Compared with a plurality of local, quasi-punctiform openings, this is advantageous. This is due to the fact that in laser beam evaporation the surface of the solar cell substrate is damaged. The damage is more serious in the edge region of the laser beam. As a result, with a plurality of quasi-punctiform openings, a less favourable ratio of problematic edge regions to good middle regions occurs than with linear openings. Also, a metallisation introduced into the linear openings contributes to an increase in the transverse conductivity of the back, which has an advantageous effect on the fill factors of the manufactured solar cells. Optionally, to reduce the damage cause by the laser beam evaporation, the openings can be over-etched, for example with an alkaline etching solution or an etching solution containing hydrofluoric acid.

If the local openings are formed by means of locally applied etching paste, it is, however, advantageous to form the openings as quasi-punctiform openings.

Alternatively, the local openings can be formed by a metallic paste with a very high glass component being applied locally onto the layer stack and being fired through it. Since the layer stack has at least one densified dielectric layer, the high glass component and an adaptation of the firing-through process is necessary. In this variant embodiment the local openings are already filled with metallic paste. In order to form electrically conductive connection of the contacts arranged in the local openings the layer stack can be printed flat with an ordinary metallic paste. Since this has a smaller glass component, any firing-through of the paste, which has been applied flat, through the layer stack of the at least one densified dielectric layer is prevented.

Preferably a metallic medium is applied extensively onto the layer stack, with some of the metallic medium thereby being injected into the local openings. This can, for example, be done by means of a printing process of prior art, for example a screen printing process. The application is extensive if the back-side area of the solar cell substrate is covered at least 80% by the metallic medium. In order to form ohmic contacts in the local openings, the solar cell substrate is fired. During firing, any firing-through of parts of the metallic medium located on the layer stack through the layer stack is prevented. The firing parameters such as temperature and time are to be selected accordingly. For example, as metallic medium, metallic pastes or printing pastes or a metallic fluid can be used. It is preferable to use aluminium-based pastes or fluids, since in this way a local back field can be formed in the regions of the local openings. This is often referred to as a local back surface field and reduces the charge carrier recombination in the regions of the local openings and/or contacts. In the case of extensive back contacts, warping of the solar cell often occurs. This is avoided, or the warping is at least reduced, in the variant embodiment described, since contacts are formed only in the local openings and thus it is only there that the metallic medium comes into direct contact with the solar cell substrate.

Advantageously, the back of the solar cell substrate is etched before applying the layer stack, using a smoothing etching solution or a polishing etching solution. In this way a smooth surface can be prepared on the back of the solar cell substrate, which has an advantageous effect on the reflection behaviour of the back of the solar cell substrate. A smoothing etching solution in this instance means an etching solution by means of which the surface of the solar cell substrate can be etched in such a way that incident light with a wavelength of between 400 nm and 1000 nm is reflected by at least 15% and less than 25%. A polishing etching solution means an etching solution by means of which the surface of the solar cell substrate can be etched in such a way that incident light with a wavelength of between 400 nm and 1000 nm is least 25% reflected.

Preferably the front side of the solar cell substrate is textured. This can be done by means of an etching medium. Especially preferably, this takes place by means of a texture etching solution. As a result of the texturing, incident light is injected increasingly obliquely into the solar cell substrate, so that an increased proportion of light can be totally reflected to the back of the solar cell substrate. This can improve the efficiency of the manufactured solar cell.

Advantageously, the front of the solar cell substrate is textured after applying the layer stack. During texturing, the layer stack is used as etching mask for the back of the solar cell substrate. In this way, one-sided texturing of the solar cell substrate can be realised economically.

After the layer stack has been held for a period of at least 5 minutes at temperatures of at least 700° C., preferably a hydrogenous silicon nitride layer is deposited onto the front of the solar cell substrate. The hydrogenous silicon nitride layer is thus deposited on the front of the solar cell substrate after the densification of at least one dielectric layer. This can for example be done using a chemical deposition process known in the art, from the vapour phase. Using the hydrogenous silicon nitride layer, defect passivation can be carried out in the volume of the solar cell substrate, as a result of which the efficiency of the manufactured solar cells can be improved. Instead of passivation by means of a hydrogenous silicon nitride layer, in principle any other type of hydrogen passivation can be selected, for example defect passivation by means of a hydrogen plasma.

The solar cell according to the invention has a layer stack of dielectric layers arranged on the back of the solar cell. At least one dielectric layer of this layer stack is densified.

A densified dielectric layer in the sense of the present invention means a dielectric layer whose resistivity to a firing-through of pastes with glass components is enhanced compared with its resistivity at a time immediately following its deposition.

A densified layer is obtained by heating the layer stacks and holding the layer stacks at temperatures of at least 700° C. for a period of at least 5 minutes.

It has proven effective to use a layer stack which has a silicon oxide layer with a thickness of less than 100 nm. Preferably it has a thickness of between 5 nm and 100 nm, especially preferably between 10 nm and 100 nm.

Advantageously the layer stack has a silicon nitride layer with a thickness of less than 200 nm. Preferably the thickness is between 50 nm and 200 nm, especially preferably between 70 nm and 150 nm.

Silicon oxide layers and silicon nitride layers in the said thicknesses can be deposited economically by means of a method known in the art, for example chemical deposition processes from the vapour phase. In the case of a silicon solar cell substrate, the silicon oxide layer can be formed by thermal oxidation of the solar cell substrate.

Advantageously, the layer stack has a silicon oxide layer and a silicon nitride layer. The silicon nitride layer is preferably arranged on the silicon oxide layer. Especially preferably the silicon oxide layer is arranged directly on the solar cell substrate and the silicon nitride layer is arranged directly on the silicon oxide layer.

Advantageously, a flat back contact is arranged on the layer stack, extending locally through the layer stack and contacting the back of a solar cell substrate. To this end, several local openings can be provided in the layer stack, through which the flat back contact extends through the layer stack.

Preferably the back contact is formed from a metallic paste, advantageously from an aluminium paste. This can, for example, be a screen printing contact, which is preferably executed in a single piece, thus has been applied in a single screen printing process.

Advantageously the back contact has glass components. These can, for example, be the glass frit usually found in screen printing pastes. These glass components enable reliable adhesion of the back contact on the layer stack.

The invention will next be explained in more detail on the basis of some figures. Wherever expedient, elements with the same effect have been given the same reference numbers. The figures show:

DESCRIPTION OF THE INVENTION

Figure 1:
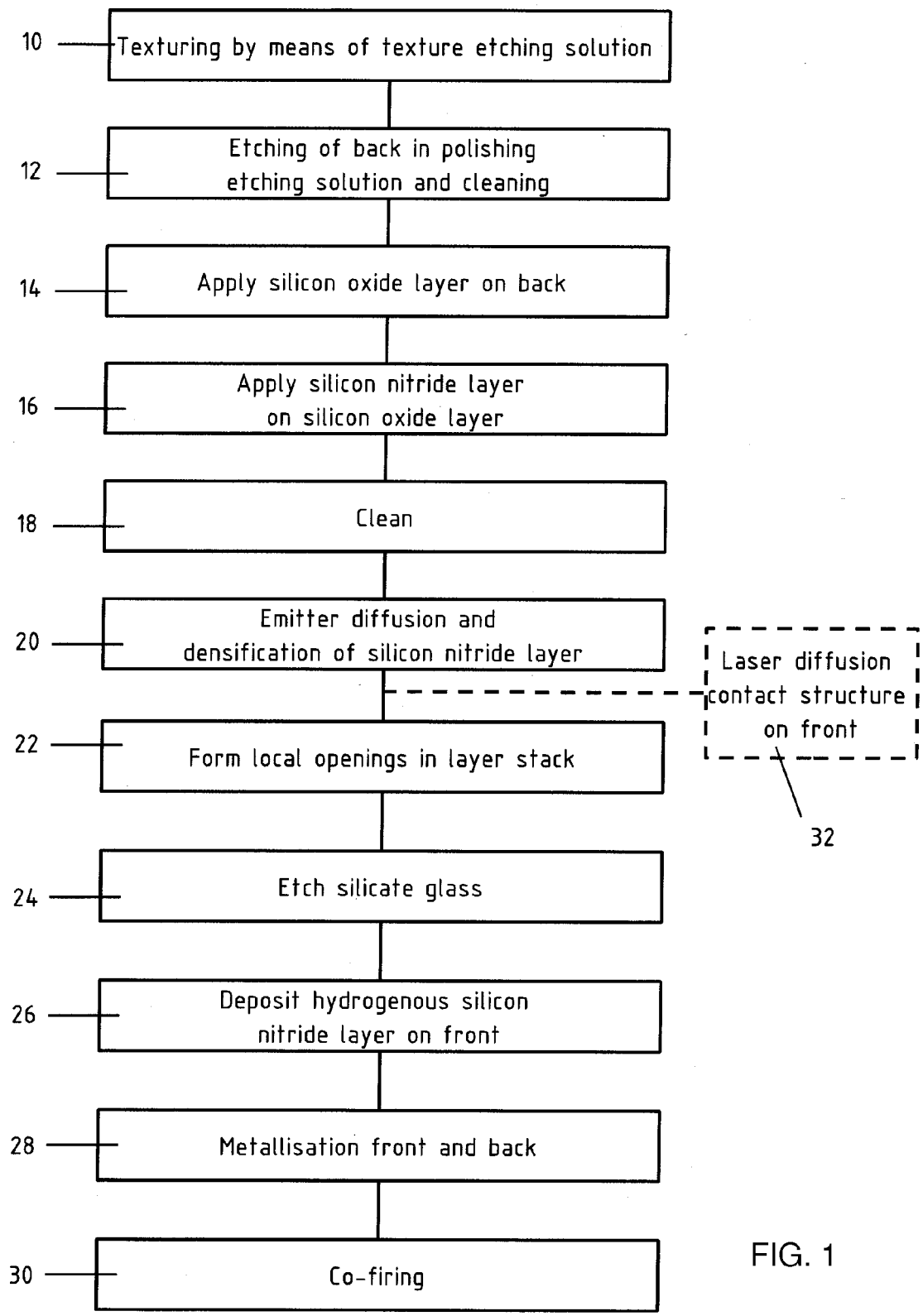
FIG. 1 Simplified diagram of a first embodiment of the method according to the invention FIG. 2 Simplified diagram of a second embodiment of the method according to the invention FIG. 3 Simplified diagram of a third embodiment of the method according to the invention FIG. 4 Schematic diagram of a solar cell according to the invention FIG. 5 Back view of the solar cell from FIG. 4 in a schematic view

FIG. 1 illustrates a first embodiment of the method according to the invention. According to this, the solar cell substrate is firstly textured 10 by means of a texture etching solution. Next, the back of the solar cell substrate is etched in a polishing etching solution 12 and cleaned 12 in a way known in the art. Next, a silicon oxide layer is applied to the back of the solar cell substrate 14. This can for example be done by a chemical deposition from the vapour phase. Preferably, however, a silicon solar cell substrate is used and the silicon oxide layer is grown thermally or deposited in the plasma phase.

Next, a silicon nitride layer is applied 16 onto the silicon oxide layer. The silicon oxide layer, together with the silicon nitride layer, forms a layer stack, which effects a dielectric reflective coating of the back of the solar cell substrate. Together with the texturing present on the front side of the solar cell substrate, this layer stack, as described above, brings about an effective reflection of incident light to the back of the solar cell substrate.

In the further course of the method the solar cell substrates are cleaned 18 in a way known in the art, for example in cleaning solutions containing hydrochloric acid and/or hydrofluoric acid. This is followed by an emitter diffusion 20, in which the layer stack consisting of the silicon oxide layer and silicon nitride layer is heated and held for a period of at least 5 minutes at temperatures of at least 700° C., so that the silicon nitride layer is densified 20. The emitter diffusion 20 can be executed as phosphorus diffusion, provided the solar cell substrate used has a p-volume doping. In this, as in all other embodiments, however, n-doped solar cell substrates can also be used. The emitter diffusion would then be executed as p-emitter diffusion, for example as boron diffusion.

Next, a phosphorus emitter diffusion in a p-doped silicon solar cell substrate will be assumed. This phosphorus diffusion can for example be in the form of a POCl$_3$ diffusion. The embodiment in FIG. 1 is, however, also suitable for precursor diffusions and is compatible with both continuous diffusion processes and with diffusions conducted in batch mode.

During the emitter diffusion 20 the layer stack of silicon oxide layer and silicon nitride layer serves as diffusion mask for the back of the solar cell substrate. During the emitter diffusion 20, therefore, no dopant is diffused into the back of the solar cell substrate. This obviates the need for edge insulation.

Following the emitter diffusion 20, a laser diffusion 32 can optionally take place on the front side of the solar cell substrate. This involves a laser beam being guided over the contact structure of the front side. The contact structure is formed from those regions in which the front contacts will be arranged at a later time. Because the laser beam is guided over this contact structure, an enhanced diffusion of dopant occurs into these regions from a silicate glass formed on the surface of the silicon solar cell substrate used during the emitter diffusion 20. If the emitter diffusion 20 has been executed as phosphorus diffusion, this is for example a phosphor silicate glass, from which additional dopant is diffused locally into the front of the silicon solar cell substrate. The laser diffusion 32 on the front thus enables the formation of a selective emitter structure.

Next, local openings are formed in the layer stack 22. As already explained above, this can be done for example by means of laser beam evaporation or using a locally applied etching paste.

Next, the silicate glass formed during the emitter diffusion 20 is etched 24 and thereby removed. In the case of a phosphorus emitter diffusion, this will be a phosphor silicate glass.

Next, a hydrogenous silicon nitride layer is deposited 26 onto the front of the solar cell substrate. This enables, as already explained above, a passivation of defect states in the volume of the solar cell substrate.

Next, the front and back of the solar cell substrate are metallised 28. Preferably this is done by means of screen printing processes. In principle however, another method, in particular another printing method, can be used. When the back is metallised, it is preferable for a metallic paste to be applied extensively on the back of the solar cell substrate and some of the metallic paste to be injected into the local openings.

The metallic pastes applied during metallisation 28 contain glass components. In a subsequent co-firing 30 the metallic paste arranged on the front is fired through the silicon nitride layer on the front and sintered into the solar cell substrate, so that an ohmic front contact is formed. The metallic paste containing glass components and applied to the back is not fired through the back silicon nitride layer during the co-firing 30, since this has been densified 20 and is thus more resistant to firing-through. Because of the glass components, the fired paste instead adheres reliably to the layer stack. It is only in regions of the local openings, in which the paste has been inserted, that sintering in of the metallic paste in the back of the solar cell substrate and a formation of ohmic contacts take place. Preferably, an aluminium paste is used as metallic paste for the back, so that during the co-firing 30 a local back field is formed in regions of the local openings.

The embodiment in FIG. 1 thus represents an economical method for the manufacture of solar cells with a dielectric back passivation and local back field. The embodiment in FIG. 1 has proven effective, especially in the manufacture of solar cells from multi- or monocrystalline silicon discs.

Figure 2:
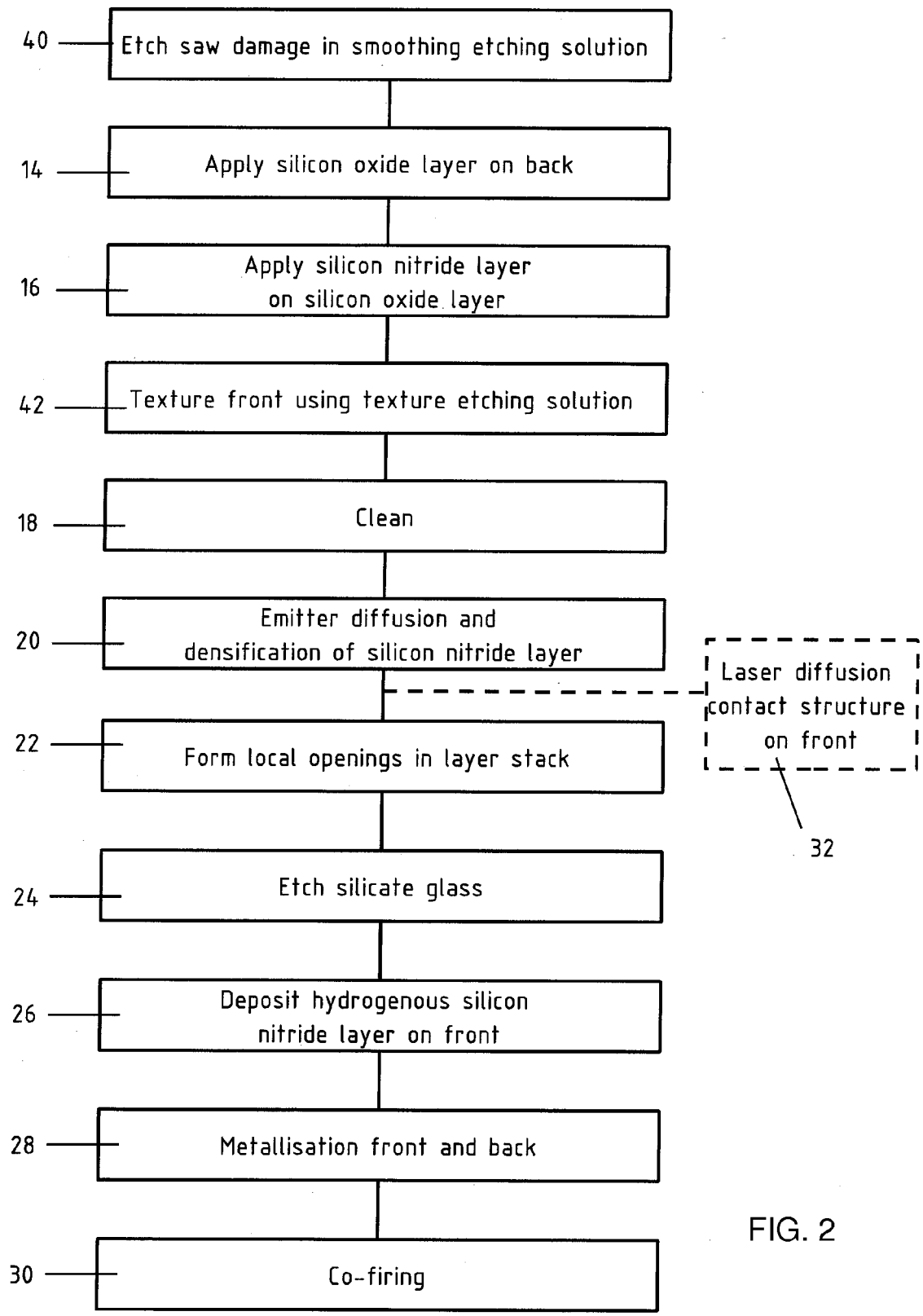

In the embodiment in FIG. 2, a silicon solar cell substrate is again used. To start with, this is etched 40 in a smoothing etching solution and this also removes any saw damage on the solar cell substrates. This results in a solar cell substrate which is smoothly etched on both front and back.

Next, as in the embodiment in FIG. 1, a silicon oxide layer is applied 14 directly onto the back of the solar cell substrate and a silicon nitride layer is applied 16 onto the silicon oxide layer.

This is followed by texturing 42 by means of a texture etching solution. The layer stack formed on the back of the solar cell substrate and consisting of the silicon oxide layer and the silicon nitride layer thereby serves as etching mask, so that only the front of the solar cell substrate is textured 42.

The rest of the method steps correspond to those for the embodiment from FIG. 1.

In the embodiment from FIG. 2 the layer stack consisting of silicon nitride layer and silicon oxide layer is thus not only used as diffusion masking during the emitter diffusion 20, but also as etching mask during the texturing 42. The expenditure for the smooth and/or polishing etching of the back of the solar cell substrate can be advantageously reduced as a result. The embodiment in FIG. 2 has proven especially effective when monocrystalline silicon discs are used as solar cell substrates for solar cell manufacture.

Figure 3:
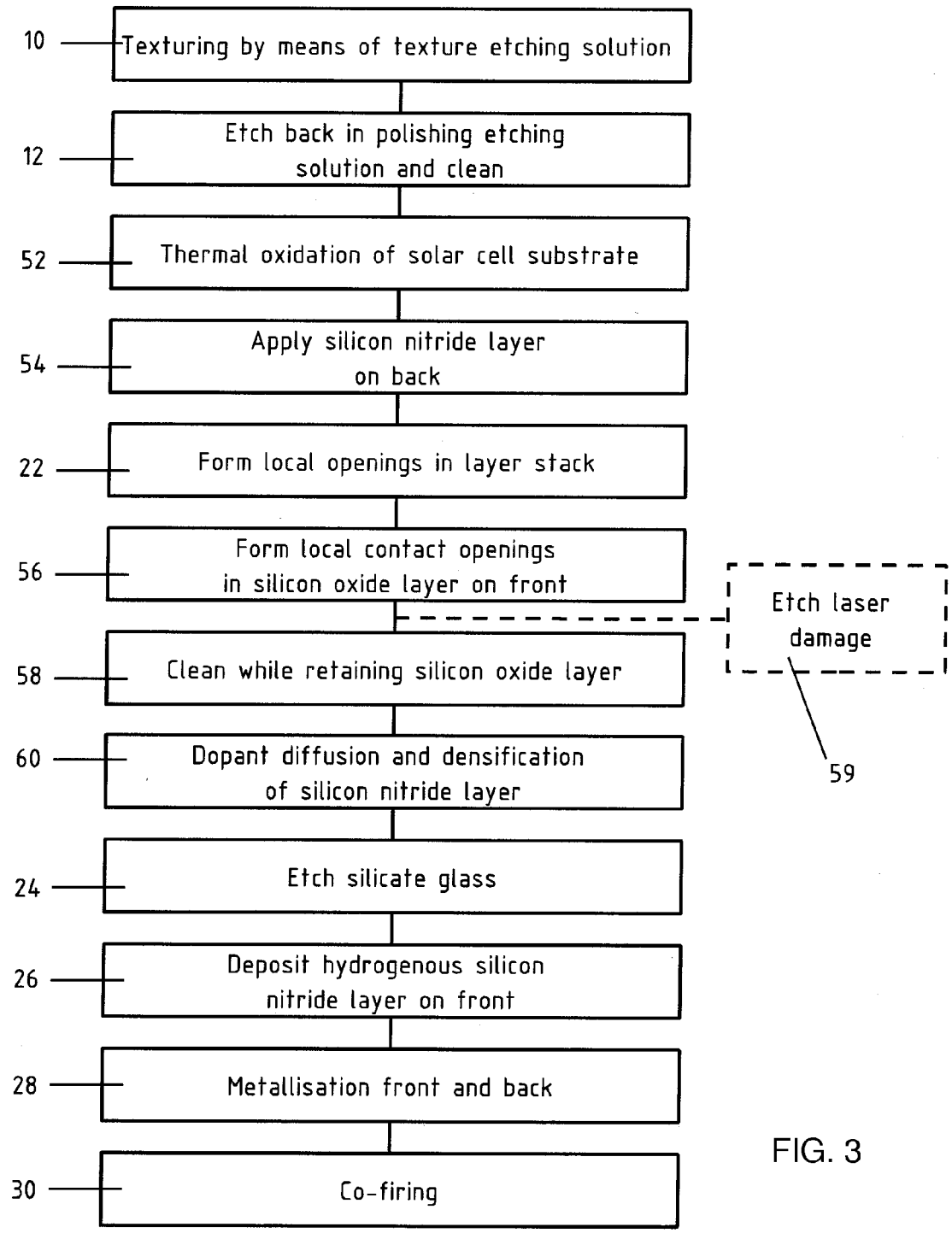

In the embodiment from FIG. 3 a silicon solar cell substrate is firstly textured 10 by means of a texture etching solution. This is followed by the etching of the back, already known from FIG. 1, in a polishing etching solution and cleaning 12.

Next, the solar cell substrate, which in this case is executed as a silicon solar cell substrate, is thermally oxidised 52. The total surface of the solar cell substrate is thus covered by a silicon oxide layer. Next, a silicon nitride layer is applied 54 on the back and therefore on the silicon oxide layer there.

Next, in the way already described in connection with FIG. 1, local openings are formed in the layer stack consisting of silicon nitride layer and silicon oxide layer.

Furthermore, local contact openings are formed in the silicon oxide layer on the front of the solar cell substrate 56. The metallic front contacts are then formed in the regions of these contact openings. The local contact openings can, for example, be formed by means of laser beam evaporation. Alternatively, there is the option of applying etching paste or another etching medium locally.

If the local contact openings in the front and/or the local openings in the layer stack are formed by means of laser beam evaporation, it can be advantageous to remove the resultant laser damage by etching, as provided by the optional method step 59. In this case an alkaline etching solution, for example a KOH solution, may be used.

During a subsequent cleaning 58 of the solar cell substrate, the silicon oxide layer is retained. Therefore hydrofluoric acid is not used during the cleaning 58. The cleaning 58 takes place using hydrochloric acid instead.

Next, a dopant diffusion 60 takes place, in which the solar cell substrates are heated and held for a period of at least 5 minutes at temperatures of at least 700° C., so that the silicon nitride layer is densified. In this dopant diffusion 60, as in the case of the emitter diffusion in FIGS. 1 and 2, this can be a p- or n-diffusion. It can also be carried out as continuous diffusion or as diffusion in batch mode. During the diffusion 60 the layer stack consisting of silicon nitride layer and silicon oxide layer on the back of the solar cell substrate again serves as diffusion mask. On the front of the solar cell substrate the dopant can penetrate through the local contact openings unhindered into the solar cell substrate where it can effect a local doping of the front. If solar cell substrates are used which already have a flat emitter diffusion on the front side, the dopant diffusion 60 can easily realise a selective emitter with heavily doped regions in the regions of the local contact openings.

Alternatively, there is the option of making the silicon oxide layer very thin and using it as diffusion-inhibiting layer, so that during the dopant diffusion 60, dopant gets through the front silicon oxide layer in reduced quantity into the solar cell substrate where it can form a weak emitter doping. In the regions of the local contact openings the dopant can, however, penetrate unhindered into the solar cell substrate where it forms heavily doped regions. The final result is a selective emitter structure which can be realised with a single dopant diffusion 60.

The rest of the method steps correspond to those in FIG. 1.

Figure 4:
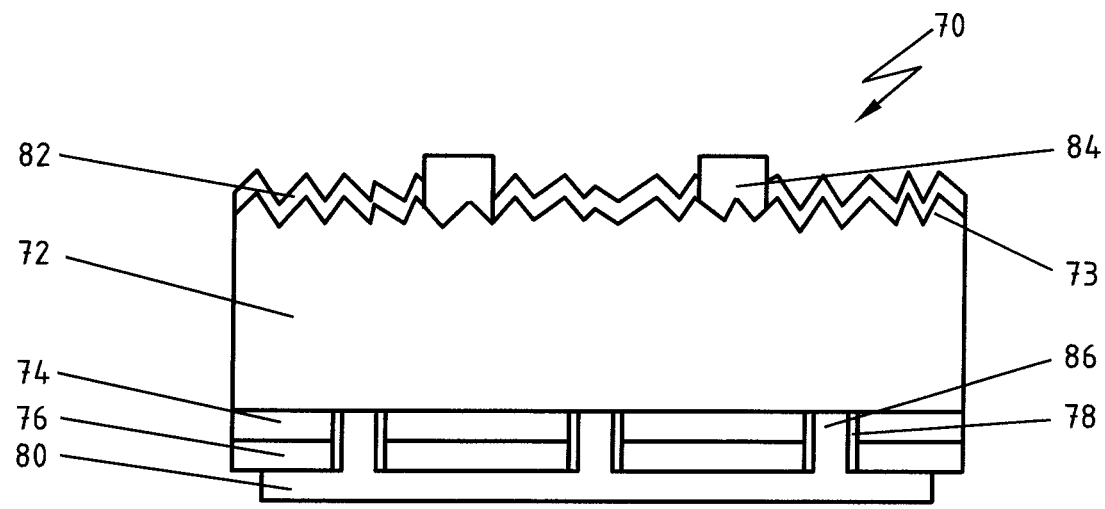

FIG. 4 illustrates schematically in a sectional view an embodiment of a solar cell according to the invention 70, which has a solar cell substrate 72 which is provided on the front with a texturing 73. On the back of the solar cell 70 a silicon oxide layer 74 is provided, which is arranged directly on the solar cell substrate 72. A densified silicon nitride layer 76 is arranged directly on the silicon oxide layer 74. The silicon oxide layer 74 and the silicon nitride layer together form a layer stack with local openings 78 through which an extensive back contact 80 extends and contacts the back of the solar cell substrate 72. On the front side of the solar cell substrate 72 a further silicon nitride layer 82 is provided as anti-reflection coating. Front contacts 84 extend through this silicon nitride layer 82.

Figure 5:
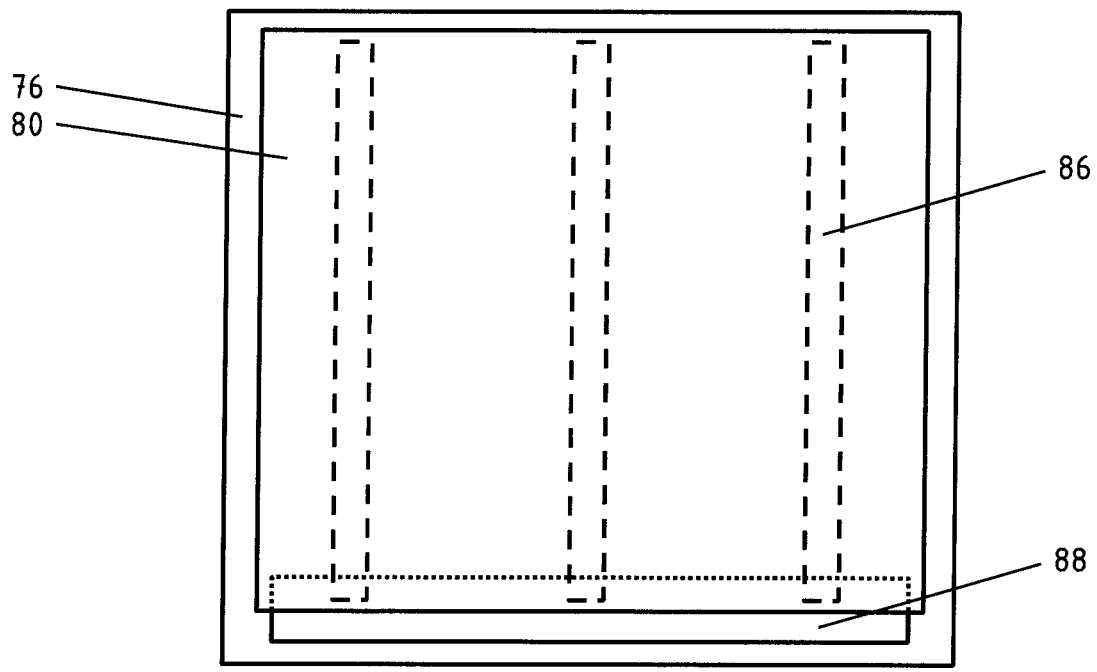

FIG. 5 shows a schematic back view of the solar cell from FIG. 4. This shows the extensive back contact 80. This partially overlaps a bus line 88, which is usually silvered and serves as solder contact for the solar cell 70.

As can be seen in FIG. 5, the local openings 78 are executed as linear openings, so that metallisation lines 86 which extend perpendicular to the bus line 88 are found in the openings. The extensive back contact 80 is formed from a metallic paste and contains glass frit. Because of this glass frit component, the flat back contact 80 adheres reliably to the silicon nitride layer 76. In a special variant embodiment the bus line can be interrupted in places, so that individual collector sections are created, which serve as solder contact.

LIST OF REFERENCE NUMBERS

10 Texturing by means of texture etching solution
12 Etching back in polishing etching solution and cleaning
14 Applying silicon oxide layer to the back
16 Applying silicon nitride layer onto silicon oxide layer
18 Cleaning
20 Emitter diffusion and densification of silicon nitride layer
22 Forming local openings in layer stack
24 Etching silicate glass
26 Deposition of hydrogenous silicon nitride layer on front side
28 Metallisation of front and back
30 Co-firing
32 Laser diffusion contact structure on front
40 Etching saw damage in smoothing etching solution
42 Texturing front by means of texture etching solution
52 Thermal oxidation of the solar cell substrate
54 Applying silicon nitride layer on back
56 Forming local contact openings in silicon oxide layer on the front
58 Cleaning while retaining silicon oxide layer
59 Etching laser damage
60 Dopant diffusion and densification of silicon nitride layer
70 Solar cell
72 Solar cell substrate
73 Texturing
74 Silicon oxide layer
76 Densified silicon nitride layer
78 Opening
80 Back contact
82 Silicon nitride layer
84 Front contact
86 Metallisation line

The invention claimed is:

1. A method of producing a solar cell, the method which comprises:
   providing a solar cell substrate with a back;
   etching the back of the solar cell substrate using a smoothing etching solution or a polishing etching solution;
   subsequently applying a layer stack of dielectric layers to the back of the solar cell substrate;
   forming local openings in the layer stack;
   heating the layer stack and holding the layer stack for a period of at least 5 minutes at temperatures of at least 700° C.;
   subsequently applying a metallic medium extensively to the layer stack and partially injecting the metallic medium into the local openings; and
   firing the solar cell substrate in order to form ohmic contacts in the local openings and preventing any firing-through of parts of the metallic medium located on the layer stack through the layer stack during firing.

2. The method according to claim 1, wherein the applying step comprises applying a layer stack including a silicon oxide layer with a thickness of less than 100 nm.

3. The method according to claim 2, wherein the silicon oxide layer has a thickness between 5 nm and 100 nm.

4. The method according to claim 2, wherein the silicon oxide layer has a thickness between 10 nm and 100 nm.

5. The method according to claim 1, wherein the applying step comprises applying a layer stack including a silicon nitride layer with a thickness of less than 200 nm.

6. The method according to claim 5, wherein the silicon nitride layer has a thickness between 50 nm and 200 nm.

7. The method according to claim 5, wherein the silicon nitride layer has a thickness between 70 nm and 150 nm.

8. The method according to claim 1, wherein the applying step comprises applying a layer stack including a silicon oxide layer and a silicon nitride layer.

9. The method according to claim 1, which comprises first applying the silicon oxide layer to the back of the solar cell substrate and then applying the silicon nitride layer to the silicon oxide layer.

10. The method according to claim 1, which comprises, after applying the layer stack on the back of the solar cell substrate, carrying out a diffusion step for diffusing dopant into the solar cell substrate and, during this diffusion step, holding the layer stack at temperatures of at least 700° C. for a period of at least 5 minutes.

11. The method according to claim 1, which comprises texturing a front of the solar cell substrate with an etching medium.

12. The method according to claim 11, which comprises texturing the front of the solar cell substrate with a texture etching solution.

13. The method according to claim 11, which comprises texturing the front of the solar cell substrate after applying the layer stack and, during the texturing, using the layer stack as an etching mask for the back of the solar cell substrate.

14. The method according to claim 1, which comprises, after the layer stack has been held at a temperature of at least 700° C. for a period of at least 5 minutes, depositing a hydrogenous silicon nitride layer on the front of the solar cell substrate.

* * * * *